(12) United States Patent
Durham et al.

(10) Patent No.: US 6,208,907 B1
(45) Date of Patent: *Mar. 27, 2001

(54) DOMINO TO STATIC CIRCUIT TECHNIQUE

(75) Inventors: Christopher McCall Durham; Visweswara Rao Kodali, both of Austin; Douglas Ele Martin, Round Rock; Harsh Dev Sharma, Austin, all of TX (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/016,653

(22) Filed: Jan. 30, 1998

(51) Int. Cl.[7] ............................. G06F 19/00; G06F 17/10; G06F 7/60; H01L 21/82
(52) U.S. Cl. .......................... 700/121; 700/120; 716/19; 395/500.2; 395/500.12; 438/129
(58) Field of Search ................................... 700/121, 120; 395/500.2, 500.12; 438/129; 716/19

(56) References Cited

U.S. PATENT DOCUMENTS

| | | | |
|---|---|---|---|
| 4,426,713 | * | 1/1984 | Shimizu et al. ............... 375/354 |
| 4,753,901 | * | 6/1988 | Ellsworth et al. .............. 438/427 |
| 5,249,133 | * | 9/1993 | Batra ........................... 395/500.06 |
| 5,440,243 | * | 8/1995 | Lyon ............................ 326/33 |
| 5,548,622 | * | 8/1996 | Ma ............................... 375/354 |
| 5,633,807 | * | 5/1997 | Fishburn et al. ............... 716/19 |
| 5,796,282 | * | 8/1998 | Sprague et al. ............... 327/210 |
| 5,801,954 | * | 9/1998 | Le et al. ...................... 395/500.22 |
| 5,815,687 | * | 9/1998 | Masleid et al. ............... 703/14 |
| 5,818,264 | * | 10/1998 | Ciraula et al. ............... 326/98 |
| 5,824,570 | * | 10/1998 | Aoki et al. ................... 438/128 |
| 5,828,234 | * | 10/1998 | Sprague ....................... 326/98 |
| 5,913,101 | * | 6/1999 | Murofushi et al. ............ 438/128 |
| 5,933,350 | * | 8/1999 | Fujimoto et al. .............. 700/121 |
| 5,942,916 | * | 8/1999 | Matsbara et al. ............. 326/83 |
| 5,943,488 | * | 8/1999 | Raza ............................ 716/19 |
| 6,034,543 | * | 3/2000 | Huang et al. ................. 326/39 |
| 6,041,169 | * | 3/2000 | Brennan ....................... 716/6 |
| 6,061,606 | * | 5/2000 | Ross ............................ 700/121 |
| 6,075,393 | * | 6/2000 | Tomita et al. ................. 327/153 |
| 6,075,830 | * | 6/2000 | Piirainen ...................... 375/354 |

* cited by examiner

*Primary Examiner*—William Grant
*Assistant Examiner*—Iván Calcaño
(74) *Attorney, Agent, or Firm*—Robert V. Wilder; Anthony V. England

(57) ABSTRACT

A method and apparatus is provided for enabling the transformation of a domino circuit to a static circuit without requiring the re-design of the chip or integrated circuit mask set. The domino circuit masks may be designed to include additional unconnected devices as appropriate which may be added or connected into the circuit after chip design release by changing only interconnection masks. Spare devices can be added and selectively used to make a domino circuit metal-mask programmable into a logically equivalent static circuit. In a first exemplary method, extra devices are added to, and/or existing devices are re-wired in the domino circuitry to make a complementary equivalent static gate. In a second exemplary methodology, the domino circuit is converted into a pseudo-NMOS circuit using devices already available in the circuit and modifying the circuit connections thereto.

14 Claims, 4 Drawing Sheets

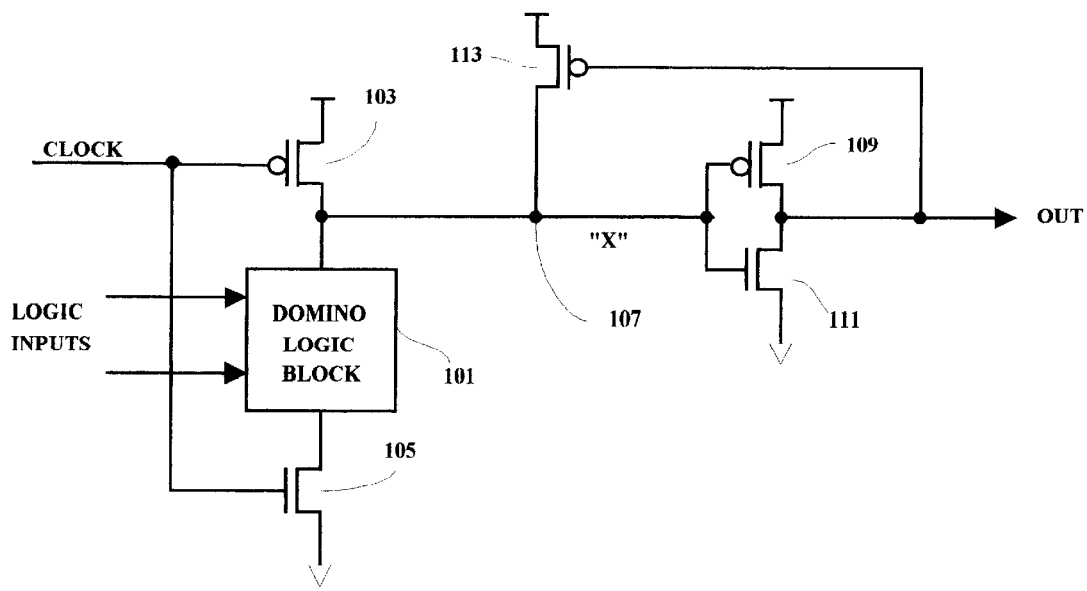
FIG. 1
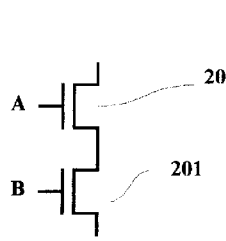 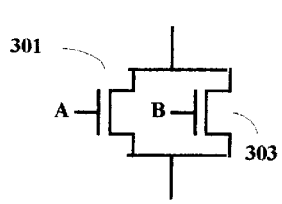 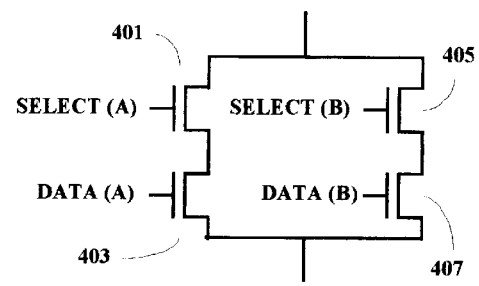
FIG. 2  FIG. 3  FIG. 4

DOMINO TO STATIC CIRCUIT TECHNIQUE

FIELD OF THE INVENTION

The present invention relates generally to digital logic signal processing circuitry and more particularly to a methodology for enabling and converting domino circuits to static circuits.

BACKGROUND OF THE INVENTION

Dynamic circuitry has long been an integral part of chip or integrated circuit design. The inherent low delay makes dynamic circuitry ideal for high speed applications, such as microprocessors, high speed logic, random access memories, etc. One popular class of dynamic circuitry is the Domino circuit.

In general, the term domino logic is used to refer to an arrangement of logic circuit stages which may, for example, be cascaded together in an integrated circuit array configuration. A signal may be inputted to a first stage where it is evaluated in order to provide an output signal to a second stage where that output signal is again evaluated to provide an output signal for propagation to and evaluation by yet another stage in the circuit. Thus a domino effect is achieved whereby signals are sequentially propagated through an array of stages or domino blocks, and each successive stage performs an evaluation of an input condition until a final output is provided at a final output stage. Domino logic circuits may be arranged so that signals can propagate through the various stages without being separately clocked at each stage.

Domino circuits consist of a domino logic block, and an NFET and PFET device pair connected to a clock signal, an output inverter (an NFET and PFET pair), and a feedback PFET device. A standard domino circuit uses logic input signals and clock signals to produce an output signal. Because of the inherent dynamic characteristic of the domino circuit, this function requires two distinct operational phases known as the precharge phase and the evaluate phase. The precharge phase sets the domino circuit to a known state during a first half cycle while the clock signal is in a low logic level. That condition typically forces the output low. The evaluate phase then permits the domino circuit to selectively switch, based on the input signals, to switch the output to a high logic level if the inputs and the logic function so determine.

The use of the Domino circuit involves some design risk and its use requires a much higher level of sophistication than a conventional simple CMOS static circuit for logic applications. The Domino circuit can fail operationally if certain conditions are not met. The primary condition is that the logic inputs to the Domino circuit must be valid during the evaluation phase of the clock. This means that the inputs must not change state during the evaluation phase. However, system electrical and other noise can cause the inputs to the Domino circuit to change state. This and other conditions are analyzed during system design to insure they are being met but the design tools are not yet fail-safe and 100% reliability cannot be guaranteed. Noise is still somewhat of an art with Domino circuitry. If an error situation is found by analysis, in a newly designed Domino circuit configuration, after release of the design to manufacturing, or by test on the first hardware, a correction or fix is necessary.

After an evaluate phase, a domino circuit cannot return to the precharge state without the precharge occurring. Therefore any false switching during the evaluate phase is non-recoverable and will cause a logical failure. Under normal operation, the domino circuit is designed to insure that false switching does not occur. However, noise on inputs and parasitic leakage may cause false switching events from which domino circuits cannot recover. Some design precautions can be taken to minimize noise and leakage problems. For example, shielding can help to minimize the coupling of events on the inputs to the domino circuit. Also, with regard to parasitic leakage through NFET devices (in the domino logic block) which may cause a loss of the precharged state, the keeper device, i.e. the feedback PFET device can be made large enough to counteract the leakage through the NFET evaluation devices inside the domino logic block. It should here be noted that the above identified false switching problems occur with dynamic domino circuits but do not occur with standard static logic circuits.

In many instances when false switching events occur in domino circuits, they are either unpredictable and due to design complexity, or happen late in a project cycle and cannot be corrected in an efficient manner. Nearly always, a complete redesign is required which will involve changes to all mask layers in order to correct the problem.

Thus there is a need to provide an improved method and apparatus for the implementation of a fix technique for failed domino circuit configurations by which noise susceptibility and false switching problems can be significantly reduced thereby increasing the reliability of domino logic circuits.

SUMMARY OF THE INVENTION

A methodology and implementing system is provided in which a dynamic circuit which exhibits false switching errors is changed into a static circuit. This circuit modification is accomplished by modifying a reduced number of mask layers. Such fixes may then be implemented in the plan of record for the circuit design or become a designated patch until a new design is generated.

In accordance with the present invention, for a dynamic circuit which may be included among other circuitry in an integrated circuit, extra or spare devices are included in the integrated circuit for the conversion of the dynamic circuit to a logically equivalent static circuit which is less susceptible to noise than the dynamic circuit. The extra device or devices are not fully connected into the dynamic circuit in a first fabrication of an integrated circuit (IC). In response to testing of the fabricated circuit, which reveals that the dynamic circuit is exposed to an unacceptable amount of noise, or that the dynamic circuit malfunctions, the dynamic circuit is converted to a static circuit in a second fabrication of the IC. The conversion may be accomplished by modifying merely an interconnect layer of the integrated circuit masks.

BRIEF DESCRIPTION OF THE DRAWINGS

A better understanding of the present invention can be obtained when the following detailed description of a preferred embodiment is considered in conjunction with the following drawings, in which:

FIG. 1 is an exemplary domino circuit;

FIG. 2 is a schematic diagram of an exemplary implementation of an AND function which may be used in connection with the domino circuit illustrated in FIG. 1;

FIG. 3 is a schematic diagram of an exemplary implementation of an OR function which may be used in connection with the domino circuit illustrated in FIG. 1;

FIG. 4 is a circuit diagram of an exemplary implementation of a multiplex function which may be used in connection with the domino circuit illustrated in FIG. 1;

DETAILED DESCRIPTION

Figure 5:
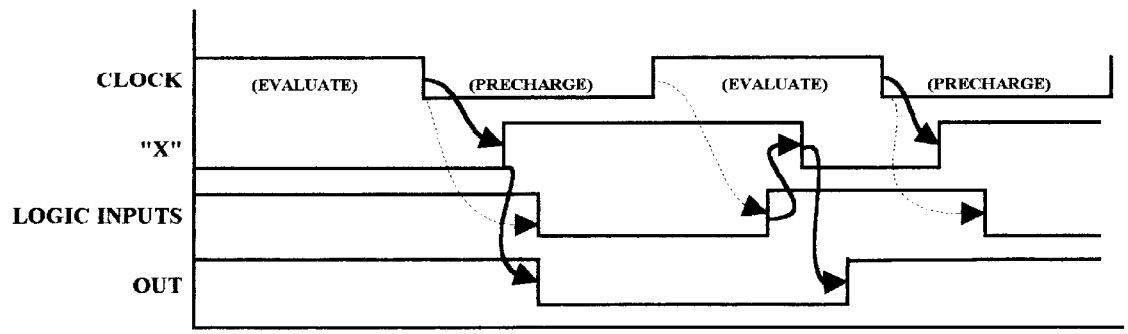
FIG. 5 is a timing chart illustrating typical timing relationships between various signals within a domino circuit.

Although the present disclosure shows isolated domino circuitry for the sake of simplicity, it is understood that the present invention is not limited to isolated logic implementations or logic array implementations but rather also includes systems in which the methodology taught herein is implemented within or as part of a single system CPU or other larger semiconductor system, chip, processor or integrated circuit. Also, in the present example, the terms source or source potential or VDD are used interchangeably to refer to a logic 1 or high level potential. Also the terms zero level, ground potential, or ground are also used interchangeably to refer to a logic 0 or low level potential.

With reference to FIG. 1, there is shown an exemplary domino logic circuit arranged to receive one clock signal and two logic inputs, and provide one output signal. The example shows a PFET device 103 is connected between a logic 1 level potential (designated in the drawings by a single horizontal line) and a domino logic block circuit 101. The transistor 103 is arranged to receive the clock signal at its gate terminal and provide an output signal at node X 107, which is the common point between the transistor 103 and the domino logic block circuit 101. An NFET device 105 is connected between the domino logic block circuit 101 and a 0 or low logic level, which is also ground in the example. Transistor 105 has its gate terminal connected to the clock input. Node X 107 is connected to a common point which connects the input gate terminals of PFET device 109 and NFET device 111. Transistors 109 and 111 are connected in series between logic 1 and ground. The common point connecting the transistors 109 and 111 provides and output signal OUT and is also connected to the gate terminal of a pull-up PFET device 113. Transistor 113 is connected between a logic 1 level and the X node 107 and functions to selectively pull-up the node 107 to the logic 1 level.

In FIG. 2, there is shown an exemplary AND gate comprising transistors 201 and 203 connected in series. Transistors 201 and 203 are arranged to plug into the domino logic block 101 shown in FIG. 1 to receive logic inputs A and B at their respective gate terminals and provide a logical AND function when both inputs are at a logic 1 level in the example. Similarly, FIG. 3 illustrates an OR gate comprising transistor 301 and 303 connected in parallel and arranged to be plugged into the domino logic block circuit 101 between the node 107 and the transistor 105. The OR gate would provide a logic 1 or high logic at its output terminals if either of its inputs A or B are at a logic 1 or high level in the present example. A MUX circuit is shown in FIG. 4. The MUX circuit includes a first set of series connected NFET devices 401 and 403 connected in parallel with a second set of series connected NFET devices 405 and 407. The MUX circuit is also designed to be plugged into the domino logic block 101 to provide a MUX function for two inputs A and B in the illustrated example.

FIG. 5 illustrates the relationship between the clock signal and the signal at node X as well as the logic input signals and the circuit output signal OUT. As illustrated, the clock signal defines a precharge state which sets the domino circuit to a known state during a first half-cycle when the clock signal is low. This will force the output OUT low. The evaluate phase occurs when the clock goes high. During the evaluate phase, the domino circuit is permitted to selectively switch depending on the type of logic circuit plugged into the domino block 101 and also the states of the logic input signals during the evaluate phase.

Figure 6:
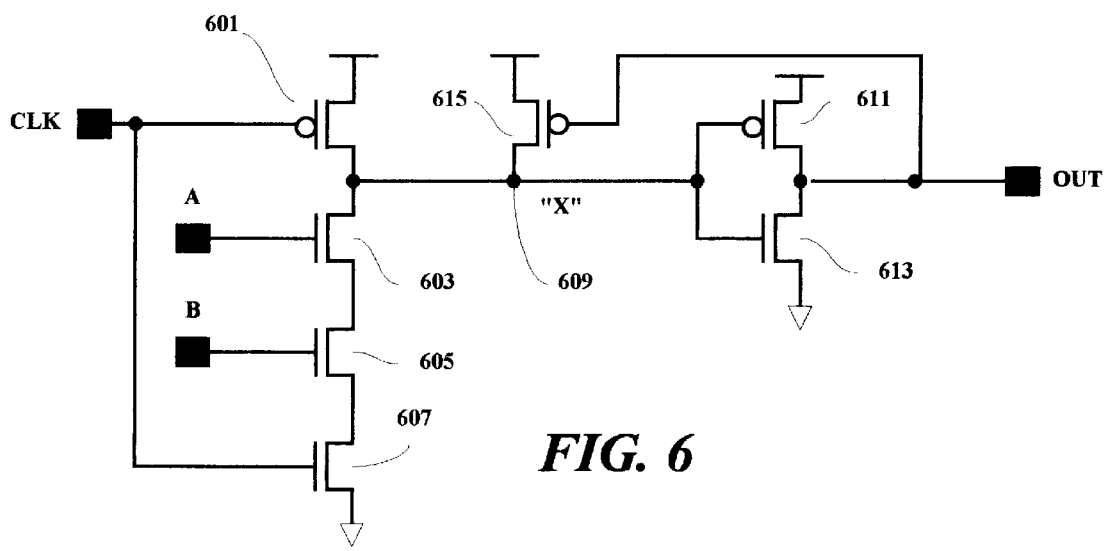
FIG. 6 is an illustration of an exemplary domino two-input AND circuit.

FIG. 6 illustrates an exemplary domino circuit including a two-input AND gate domino logic block. A clock input node is arranged to receive a clock signal CLK for application to a gate terminal of a PFET device 601. Transistor 601 is connected between a high logic level and a node X 609. Three series connected NFET devices 603, 605 and 607 are connected between the X node 609 and ground. The input to transistor 607 is connected to the clock input node and the input terminals of transistors 603 and 605 are arranged to receive input logic signals A and B, respectively. A pull-up PFET device 615 is connected between the high logic potential and the X node 609. The X node 609 is also connected to a common point connected between the gate terminal of a PFET device 611 and the gate terminal of an NFET device 613. Transistors 611 and 613 are serially connected between the high logic potential and ground. A common point between the serially connected transistors 611 and 613 is connected to an output node and also to the gate terminal of the PFET pull-up transistor 615.

In operation, the domino AND circuit illustrated in FIG. 6 functions to provide a logic 1 or high logic level output if both of the input signals A and B are at a logic 1 level during the evaluation phase of the logic circuit. Following the evaluation phase, the clock signal goes low, which turns on the PFET device 601 and effects the application of the high logic level to the X node 609. That operation turns on transistor 613 which pulls the output low. When the output goes low, pull-up transistor 615 conducts and holds the X node 609 high, and the output low, until the next evaluate phase.

Figure 7:
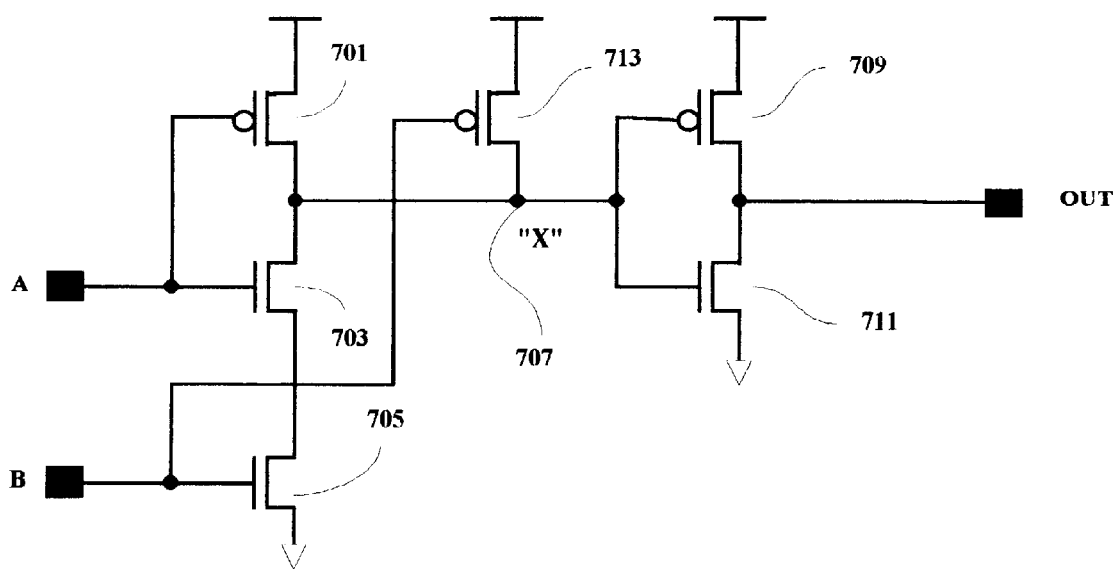
FIG. 7 is an illustration of an exemplary static two-input AND circuit converted from the domino circuit shown in FIG. 6.

In FIG. 7, The circuit of FIG. 6 has been re-configured from a domino AND logic circuit into a static AND gate circuit. As illustrated, a PFET device 701 is connected between a high logic potential and an X node 707. Two serially connected NFET devices 703 and 705 are connected between the X node 707 and ground. Transistors 703 and 705 are arranged to receive A and B inputs, respectively, at their gate or input terminals. In the FIG. 7 embodiment, the A input signal is also applied to the input terminal of the transistor 701. A pull-up PFET device 713 is also connected between the X node 707 and the high logic potential. The input terminal of the transistor 713 is arranged to receive the B input signal in the example. The X node 707 is connected to a common point which connects the input terminals of PFET device 709 and NFET device 711. Transistors 709 and 711 are serially connected between the high logic potential and ground. The common point between the series connected transistors 709 and 711 is arranged to provide an output signal OUT.

With regard to the domino circuit of FIG. 6 and the static circuit of FIG. 7, it is noted that for many domino circuits, extra or spare devices can be added and selectively used to make a domino circuit metal-mask(s) programmable into an equivalent (in a logic sense) static circuit. Two exemplary methods are herein disclosed for accomplishing this transformation. In a first technique, extra devices are added to, and/or existing devices are re-wired in the domino circuit to make a fully complementary equivalent static gate.

For example, the domino circuit of FIG. 6 can be transformed into the static circuit of FIG. 7 by applying the following changes. For device 603, which corresponds to device 703 in FIG. 7, no changes are made in the present example and the device will function in both the domino circuit of FIG. 6 and the static circuit of FIG. 7 as the evaluate NFET for the A input. For transistor 601, which functions as a precharge clock device in FIG. 6, the gate is connected to A instead of CLK and the corresponding transistor 701 in FIG. 7 functions as the evaluate PFET for A. For the B input evaluate NFET 605, the source is connected to ground instead of to the drain of NFET 607, and the corresponding device 705 in the static circuit of FIG. 7 becomes the evaluate NFET for the input signal B. The gate of the keeper device 615 is connected to B instead of OUT and the corresponding device 713 becomes the evaluate PFET for B. There are no connection changes made for the devices 611 and 613, which continue to function as output inverters. For the evaluate clock device 607, there are two change options. Either (1) the drain is disconnected and allowed to float or (2) the gate terminal is connected to internal node X, the source to ground and the drain to OUT. In the first instance when the drain is disconnected, the transistor 607 serves no function in the FIG. 7 static circuit and has no corresponding device shown. In the second instance, the transistor 607 is connected in parallel with the transistor 613. When transistor 607 is re-wired to be in parallel with transistor 613, the overall drive strength of transistor 613 becomes that of transistor 613 plus that of transistor 607. This may be desired because in domino circuitry, transistor 613 in FIG. 6 is typically smaller than transistor 611 by a factor of four or more, which means that the pull-down of OUT will be very slow when transformed into the circuit of FIG. 7.

The disclosed method can be extended to any domino logic circuit to reconfigure the domino circuit into a logically equivalent static circuit. Any number of additional devices and/or re-wiring changes can be added to the domino circuit layout to make a resulting static circuit. Such additional devices can be included in appropriate domino circuit masks such that the changeover from a domino circuit to a static circuit can be readily be made if necessary without redesigning the transistor-defining masks. One or more extra transistors are selectively included in dynamic circuit layouts based on an analysis of (i) the amount of noise that the circuit can tolerate and still function properly, and (ii) the estimated amount of noise expected in the vicinity of the circuitry, i.e. the amount of noise to which the circuit is exposed.

Further examples for changing domino circuit to static logically equivalent circuits include, among others, a three input AND gate, two and three input OR gates and two-way MUX circuits. For a three input AND gate, all of the wiring changes described above for the two input AND gate would be required as well as wiring in the added PFET to receive the third input. For a two input OR gate, no additional devices would be required and the devices 601 and 615 would be wired in series instead of in parallel as was the case for the AND gate. A three input OR gate would require all of the changes as the two input OR gate and would further require the additional wiring in for a third series PFET for the third input. For a two-way MUX circuit, two additional PFETs are required, and connected in series/parallel fashion in complement to the NFETs.

Figure 8:
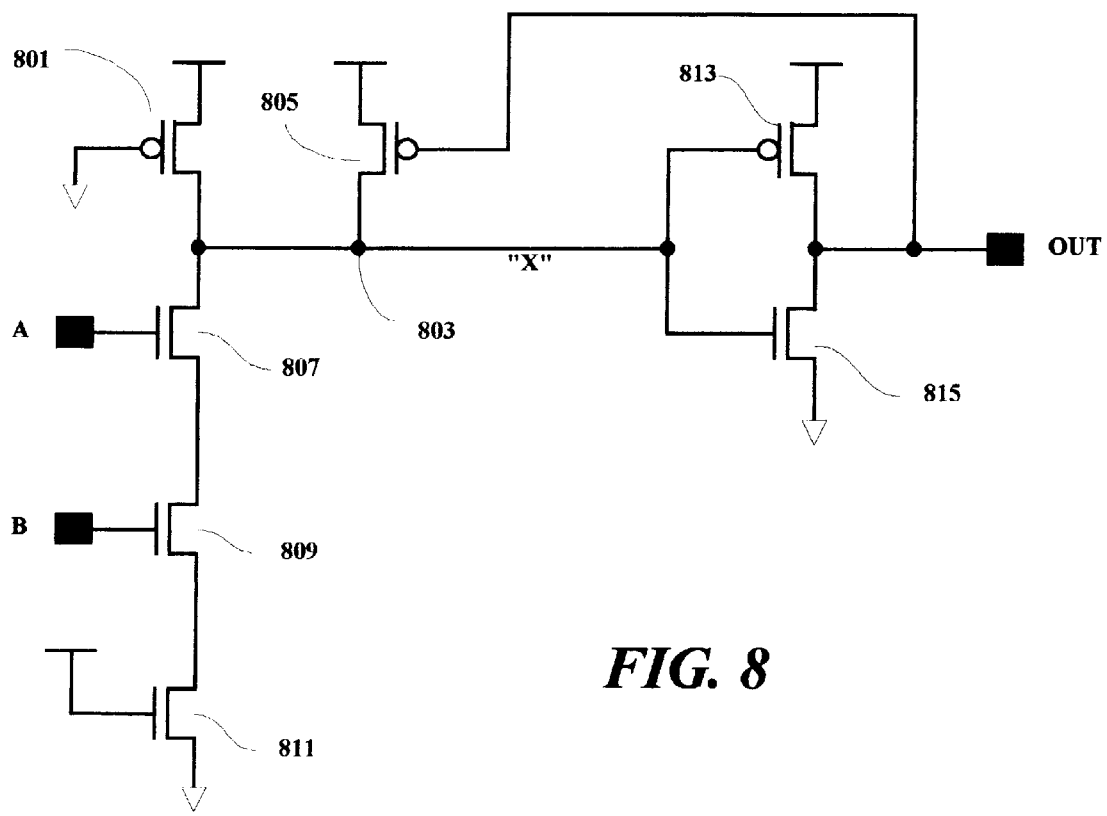
FIG. 8 is an illustration of an exemplary pseudo-NFET two-input AND circuit converted from a domino two-input AND circuit.
Figure 9:
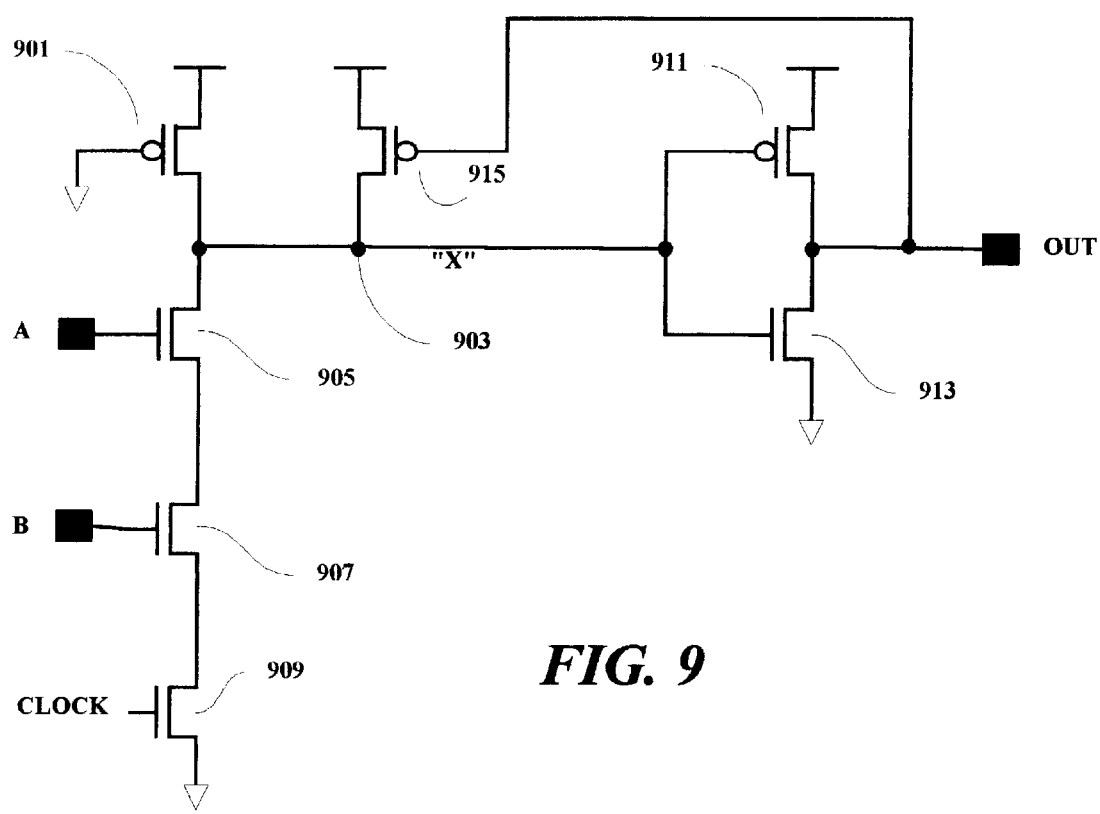
FIG. 9 is an illustration of an alternate pseudo-NFET two input AND circuit converted from a domino two-input AND circuit.

In another technique, a domino circuit may be converted into a pseudo NMOS circuit using devices already available in the circuit. This may be accomplished, for example, by tying a PFET device to node X to create a resistive load pull-up circuit. FIG. 8 and FIG. 9 show transformed circuits for the two exemplary methods in transforming the two input AND gate shown in FIG. 6.

In FIG. 8, a PFET device 801, which is a PMOS transistor in the present example, is connected between the high logic potential and an internal X node 803. Three serially connected NFET devices 807, 809 and 811 connect the X node 803 to ground. The input terminals of the NFET devices 807, and 809 are arranged for connection to input signals A and B, respectively, and NFET device 811 has its input terminal connected to the high logic potential. The X node is also connected to a common point connected to the input terminals of PFET device 813 and NFET device 815. The devices 813 and 815 are serially connected between the high logic potential and ground, and the common point between the output terminals of the devices 813 and 815 is connected to an output node OUT and also to the gate terminal of a PFET device 805. PFET device 805 is connected between the high logic potential and the X node.

In FIG. 9, a PFET device 901, which is a PMOS transistor in the present example, is connected between the high logic potential and an internal X node 903. Three serially connected NFET devices 905, 907 and 909 connect the X node 903 to ground. The input terminals of the NFET devices 905, and 907 are arranged for connection to input signals A and B, respectively, and NFET device 909 has its input terminal connected to the clock node CLK. The X node is also connected to a common point connected to the input terminals of PFET device 911 and NFET device 913. The devices 911 and 913 are serially connected between the high logic potential and ground, and the common point between the output terminals of the devices 911 and 913 is connected to an output node OUT and also to the gate terminal of a PFET device 915. PFET device 915 is connected between the high logic potential and the X node.

The two methods illustrated in FIG. 8 and FIG. 9 differ in the use of the clock signal CLK and the connection to transistor 811 and corresponding transistor 909. In the first, transistor 811 has its gate tied to the supply, and in the second, the gate of transistor 909 remains tied to CLK as in the FIG. 6 embodiment. Either of the two implementations are possible and both will yield the proper functionality as the value of the resulting signal OUT is only required when CLK is high. The first method (FIG. 8) has the advantage that no dependency on CLK exists. This may be desirable for fully static operation. The second method (FIG. 9) has the advantage that no DC power path exists when CLK is low, which can aid in reliability screening.

In designing the masks, transistor 801 (and transistor 901 for the FIG. 9 implementation), in conjunction with transistor 805 (and transistor 915 for the FIG. 9 implementation) must be sufficiently small to allow node X to be pulled low. This can be aided by reducing the pull-up strength of the circuits, for example, by creating transistors 801 and 901 as two PFETs in parallel, then connecting only part of the device. That can be accomplished easily during circuit layout. Reducing pull-up strength can also be aided by disconnecting transistors 805 or 915, respectively, or by using transistor 805 rather than transistor 801 (or 915 rather than 901) as the pull-up transistor. In that case, the gate of 805 (or 915) is grounded and that the gate of 801 (or 901) is tied to the supply or high logic potential.

The second technique therefore, can be performed on any domino circuit using the following method: (1) create a pull-up PFET device from existing devices in the circuit layout; and (2) tie the NFET evaluate transistor gate to either the clock signal CLK or the supply potential. The second technique thus requires the addition of no transistors at the expense of symmetrical switching performance. Using the disclosed methodology, additional devices are designed into the masking for a domino circuit layout, but are not initially connected, such that if failures occur during testing of the domino circuit, the circuit can be easily changed into a static circuit (which is less susceptible to problems typically affecting domino circuitry), by changing only a small number connections in the interconnect or back-end masks.

For a number of logic functions, examples have been shown of the dynamic circuit for such a logic function, and the corresponding static circuit. Particularly, the additional transistor or transistors needed for the equivalent static circuit have been shown. In a large integrated circuit, such as a microprocessor, it may not be practical to include the additional transistor or transistors to convert each dynamic circuit to a static circuit. There are typically too many dynamic circuits on the IC for this to be practical. Therefore, the additional transistor or transistors are included for only selected dynamic circuits. A dynamic circuit is selected based on an analysis of i) an amount of noise the circuit can tolerate, and ii) an estimated amount of noise to which the circuit will be exposed.

The method and apparatus of the present invention has been described in connection with a preferred embodiment as disclosed herein. Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A method for creating an integrated circuit, said method comprising the steps of:

preparing a mask set for fabricating an integrated circuit, said mask set including transistor layout masks and a transistor interconnection layer mask, said interconnection layer mask being designed to effect connections between transistors defined by said transistor layout masks in a first circuit configuration, said first circuit configuration including a clock terminal arranged for receiving a clock signal, said first circuit configuration being selectively operable to provide a predetermined logic function, said predetermined logic function being synchronized relative to said clock signal; and providing at least one unconnected transistor device in said transistor layout masks, said unconnected transistor being arranged to be unconnected in said first circuit configuration, said unconnected transistor device being arranged to be selectively connected within a second configuration of said integrated circuit by modification of only said transistor interconnection layer mask, said second circuit configuration being disconnected from said clock terminal, said second circuit configuration being selectively operable to provide said predetermined logic function in a manner which is unsynchronized relative to said clock signal.

2. The method as set forth in claim 1 wherein a plurality of said unconnected transistors are included in said transistor layout masks.

3. The method as set forth in claim 2 wherein said integrated circuit is a domino circuit.

4. The method as set forth in claim 1 wherein said integrated circuit includes a dynamic circuit.

5. The method as set forth in claim 4 and further comprising the step of modifying the interconnection layer mask to connect said unconnected transistor in a first manner to transform said dynamic circuit into a static circuit.

6. The method as set forth in claim 4 wherein said unconnected transistors are connected in a first manner to transform said domino circuit into a domino circuit and static circuit combination design.

7. A method for converting a dynamic circuit to a static circuit, said method comprising:

preparing a mask set, including transistor layout masks and transistor interconnection masks, said mask set being for use in fabricating said dynamic circuit including all required transistors and interconnections for said dynamic circuit in a first circuit configuration, said first circuit configuration including a clock terminal arranged for receiving a clock signal, said first circuit configuration being selectively operable to provide a predetermined logic function, said predetermined logic function being synchronized relative to said clock signal; and changing predetermined ones of said interconnections by modification of only said transistor interconnection masks, said dynamic circuit being thereby converted into a static circuit having a second circuit configuration, said second circuit configuration being disconnected from said clock terminal, said second circuit configuration being selectively operable to provide said predetermined logic function in a manner which is unsynchronized relative to said clock signal.

8. The method as set forth in claim 7 wherein said dynamic circuit is a dynamic logic circuit and said static circuit is functionally equivalent to said dynamic logic circuit.

9. A method for converting a dynamic circuit to a static circuit, said method comprising:

preparing a mask set, including transistor layout masks and transistor interconnection masks, said mask set being for use in fabricating said dynamic circuit including all required transistors and interconnections for said dynamic circuit; and changing predetermined ones of said interconnections by modification of only said transistor interconnection masks, said dynamic circuit being thereby converted into a static circuit, wherein said dynamic circuit comprises first transistor connected to a first logic level, a fourth transistor connected to a second logic level, and second and third transistors connected in series between said first and fourth transistors, respectively, said first and fourth transistors having a gate terminal of each of said first and fourth transistors arranged to receive a clock input signal, said second and third transistors having a gate terminal of each of said second and third transistors arranged to receive input signals.

10. The method as set forth in claim 9 wherein said predetermined ones of said interconnections comprise said gate terminals of said first and fourth transistors whereby said gate terminal of said first transistor of said static circuit is connected to said second logic level and said gate terminal of said fourth transistor of said static circuit is connected to said first logic level in converting said dynamic circuit to said static circuit.

11. The method as set forth in claim 9 wherein said dynamic circuit further includes a fifth transistor connected between said first logic level and said internal node, said fifth transistor having its gate terminal connected to an output terminal of said dynamic circuit, said changing step further including:

disconnecting said fourth transistor;

connecting said gate terminal of said first transistor to said gate terminal of said second transistor;

connecting said third transistor to said second logic level;

disconnecting said gate terminal of said fifth transistor from said output of said dynamic circuit; and connecting said gate terminal of said fifth transistor to said gate terminal of said second transistor.

12. The method as set forth in claim 9 wherein said changing step further includes:

disconnecting said gate terminal of said first transistor from said clock signal; and connecting said gate terminal of said first transistor to said second logic level.

13. A mask set for fabricating an integrated circuit, said mask set comprising:

a number of transistor layout masks for fabricating transistor circuitry, said masks including a layout having transistors for a dynamic circuit having a first circuit configuration, said first circuit configuration including a clock terminal arranged for receiving a clock signal, said first circuit configuration being selectively operable to provide a predetermined logic function, said predetermined logic function being synchronized relative to said clock signal, said masks further including transistors for converting the dynamic circuit into a logically equivalent static circuit having a second circuit configuration, said second circuit configuration being disconnected from said clock terminal, said second circuit configuration being selectively operable to provide said predetermined logic function in a manner which is unsynchronized relative to said clock signal; and an interconnect layer mask for interconnecting the transistors, wherein the dynamic circuit of said first configuration is convertible into the static circuit of said second configuration by modification of solely the interconnect layer mask.

14. The mask set as set forth in claim 13 wherein the layout for the dynamic circuit and for converting the dynamic circuit into a logical equivalent static circuit includes at least one transistor for the static circuit in addition to the transistors for the dynamic circuit.

* * * * *